United States Patent
Matayabas, Jr. et al.

(10) Patent No.: US 6,924,027 B2
(45) Date of Patent: Aug. 2, 2005

(54) PHASE CHANGE THERMAL INTERFACE MATERIALS INCLUDING EXFOLIATED CLAY

(75) Inventors: James Christopher Matayabas, Jr., Chandler, AZ (US); Paul A. Koning, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 20 days.

(21) Appl. No.: 10/405,097

(22) Filed: Mar. 31, 2003

(65) Prior Publication Data

US 2004/0191503 A1 Sep. 30, 2004

(51) Int. Cl.$^7$ .............................. B32B 5/16; B32B 27/00
(52) U.S. Cl. ....................... 428/323; 428/324; 428/328; 428/329; 428/500
(58) Field of Search ................................. 428/323, 324, 428/328, 329, 330, 332, 339, 411.1, 484, 500

(56) References Cited

U.S. PATENT DOCUMENTS 5,652,290 A * 7/1997 Nakamura et al. .......... 524/437
6,451,422 B1 * 9/2002 Nguyen ....................... 428/323

OTHER PUBLICATIONS

Callister, Jr.; Materials Science and Engineering, An Introduction, Third Edition.*

* cited by examiner

*Primary Examiner*—Sheeba Ahmed
(74) *Attorney, Agent, or Firm*—Schwegman, Lundberg, Woessner & Kluth, P.A.

(57) ABSTRACT

A thermal interface material is a nanocomposite phase change thermal interface material that includes one or more matrix polymers, one or more thermally conductive fillers, and one or more clay materials. An electronic device includes at least two surfaces joined using the nanocomposite phase change thermal interface material that includes one or more matrix polymers, one or more thermally conductive fillers, and one or more clay materials.

28 Claims, 2 Drawing Sheets

US 6,924,027 B2

PHASE CHANGE THERMAL INTERFACE MATERIALS INCLUDING EXFOLIATED CLAY

FIELD OF THE INVENTION

The present invention relates generally to apparatus and methods for the dissipation of thermal energy from heat-producing components. More particularly, it relates to the attachment of a heat sink to a heat-producing component using a thermal interface material.

BACKGROUND OF THE INVENTION

Today's semiconductor devices, whether discrete power or logic ICs, are smaller, run faster, do more and generate more heat. Some desktop microprocessors dissipate power levels in the range of 50 to 100 watts. These power levels require thermal management techniques involving large capacity heat sinks, good air flow and careful management of thermal interface resistances. A well designed thermal management program will keep operating temperatures within acceptable limits in order to optimize device performance and reliability.

Semiconductor devices are kept within their operating temperature limits by transferring junction generated waste heat to the ambient environment, such as the surrounding room air. This is best accomplished by attaching a heat sink to the semiconductor package surface, thus increasing the heat transfer between the hot case and the cooling air. A heat sink is selected to provide optimum thermal performance. Once the correct heat sink has been selected, it must be carefully joined to the semiconductor package to ensure efficient heat transfer through this newly formed thermal interface.

Thermal materials have been used to join a semiconductor package and a heat sink, and to dissipate the heat from the semiconductor devices, such as microprocessors. Thermal interface material (TIM) typically comprises a polymer matrix and a thermally conductive filler. The TIM technologies used for electronic packages encompass several classes of materials such as epoxies, greases, gels and phase change materials.

Metal filled epoxies commonly are highly conductive materials that thermally cure into highly crosslinked materials. However, they have significant integration issues with other components of the package. For example, metal filled epoxies exhibit localized phase separation within the material. This is driven by package thermo-mechanical behavior that results in high contact resistance. Furthermore, the high modulus nature of epoxies leads to severe delamination at the interfaces.

Thermal greases are in a class of materials that offers several advantages compared to other classes of materials, including good wetting and ability to conform to the interfaces, no post-dispense processing, and high bulk thermal conductivity. Greases provide excellent performance in a variety of packages; however, greases cannot be used universally with all packages due to degradation of thermal performance during temperature cycling. It is observed that in some packages greases migrate out from between the interfaces under cyclical stresses encountered during temperature cycling. This phenomenon is known as "pump out." The extensive thermo-mechanical stresses exerted at the interface during temperature cycling are due to the relative flexing of the die and the plate of the heat sink with changes in temperature. Because the pump-out phenomenon is inherently related to the formulation chemistries utilized in greases, all typical greases are subject to pump-out.

Gels typically comprise a crosslinkable silicone polymer, such as vinyl-terminated silicone polymer, a crosslinker, and a thermally conductive filler. Gels combine the properties of both greases and crosslinked TIMs. Before cure, these materials have properties similar to grease. They have high bulk thermal conductivities, have low surface energies, and conform well to surface irregularities upon dispense and assembly, which contributes to thermal contact resistance minimization. After cure, gels are crosslinked filled polymers, and the crosslinking reaction provides cohesive strength to circumvent the pump-out issues exhibited by greases during temperature cycling. Their modulus (E') is low enough (in the order of mega-pascal (MPa) range compared to giga-pascal (GPa) range observed for epoxies) that the material can still dissipate internal stresses and prevent interfacial delamination. Thus, the low modulus properties of these filled gels are attractive from a material integration standpoint. However, even though the modulus of the gels currently used in the industry is low, it is not low enough to survive the reliability-stressing test. The present invention provides a TIM that has lower modulus that meets the performance requirements of electronic packages and also survives the reliability-stressing test.

Phase change materials (PCMs) are in a class of materials that undergo a transition from a solid to a liquid phase with the application of heat. These materials are in a solid state at room temperature and are in a liquid state at die operating temperatures. When in the liquid state, PCMs readily conform to surfaces and provide low thermal interfacial resistance. PCMs offer ease of handling and processing due to their availability in a film form and the lack of post dispense processing. However, from a formulation point, the polymer and filler combinations that have been utilized in PCMs restrict the bulk thermal conductivities of these materials. In general pump-out, bleed-out, and dry-out are continuing reliability issues for phase change TIMs. The current olefinic PCMs are not able to provide the required reliability performance due to the higher die temperatures and increasing reliability requirements.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

Figure 1:
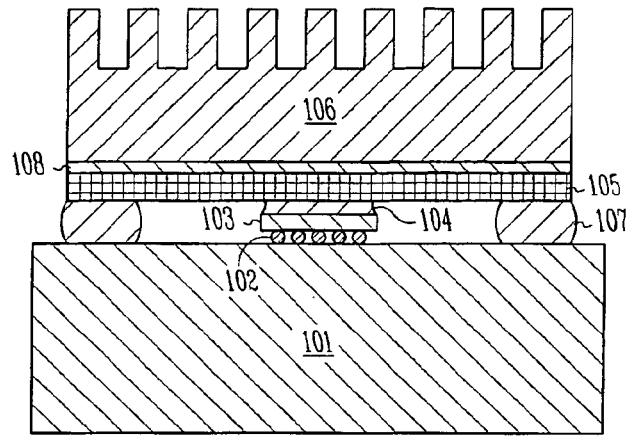
FIG. 1 is a cross-section view of a semiconductor package that uses an embodiment of a thermal interface material of the invention.

The description set out herein illustrates the various embodiments of the invention, and such description is not intended to be construed as limiting in any manner.

DETAILED DESCRIPTION

In the following detailed description, reference is made to the accompanying drawings, which are not necessarily to scale, which form a part hereof, and in which are shown, by way of illustration, specific embodiments in which the apparatus and methods can be practiced. These embodiments are described in sufficient detail to enable those skilled in the art to practice them, and it is to be understood that the embodiments can be combined, or that other embodiments can be utilized and that procedural changes can be made without departing from the spirit and scope of the present invention. The following detailed description is, therefore, not to be taken in a limiting sense, and the scope is defined by the appended claims and their equivalents. In the drawings, like numerals describe substantially similar components throughout the several views.

Whenever used in this specification or claims, the terms set forth shall have the following meanings:

"Clay material," "layered clay" or "layered clay material" shall mean any organic or inorganic material or mixtures thereof, which is in the form of a plurality of adjacent, bound layers. The layered clay comprises platelet particles and is typically swellable.

"Platelet particles," "platelets" or "particles" shall mean individual or aggregate unbound layers of the layered clay material. These layers may be in the form of individual platelet particles, ordered or disordered small aggregates of platelet particles (tactoids), and small aggregates of tactoids.

"Dispersion" or "dispersed" is a general term that refers to a variety of levels or degrees of separation of the platelet particles. The higher levels of dispersion include, but are not limited to, "intercalated" and "exfoliated."

"Intercalated" or "intercalate" shall mean a layered clay material that includes an intercalant disposed between adjacent platelet particles or tactoids of the layered material to increase the interlayer spacing between the adjacent platelets and tactoids. In this invention, the intercalant is preferably an organic cation and may also be a matrix polymer.

"Exfoliate" or "exfoliated" shall mean platelets dispersed predominantly in an individual state throughout a carrier material, such as a matrix polymer. Typically, "exfoliated" is used to denote the highest degree of separation of platelet particles.

"Exfoliation" shall mean a process for forming an exfoliate from an intercalated or otherwise less dispersed state of separation.

"Nanocomposite(s)" or "nanocomposite composition(s)" shall mean a polymer or copolymer having dispersed therein a plurality of individual platelets obtained from an exfoliated, layered clay material.

"Matrix polymer" shall mean a thermoplastic or melt-processible polymer in which the platelet particles are dispersed to form a nanocomposite. In this invention, however, the platelet particles are predominantly exfoliated in the matrix polymer to form a nanocomposite.

The following figures refer to apparatus and methods for a heat transfer apparatus adapted to be used on a semiconductor or an electronic device, such as, but not limited to, a microprocessor for use in a computer. The scope of the invention is not to be limited to microprocessors specifically nor computer assemblies in general. The scope of the invention includes, but is not limited to, any device or apparatus requiring the benefits of a heat transfer apparatus that includes a thermal interface material of this invention.

FIG. 1 illustrates a cross-section view of a semiconductor package 100 which uses an embodiment of the invention. The semiconductor package 100 includes a substrate 101 having a semiconductor device 103 mounted on a top surface of the substrate 101. In one embodiment the substrate 101 is a printed circuit board. In another embodiment, the substrate 101 may be a different material, such as silicon or ceramic.

The semiconductor device 103 is mechanically and electrically coupled to the top surface of the substrate 101 via a plurality of solder bump connections 102. In some embodiments, the gap may be filled with an epoxy underfill material (not shown). The substrate 101 contains at least one wiring layer (not shown) that electrically connects the device to pins or balls located along the bottom surface of the substrate 101. The solder balls 102 are placed in an array and are commonly referred to as a ball grid array. Because the semiconductor device 103 is flipped into place so the solder balls 102 electrically and mechanically connect to pads or lands in the substrate 101, the semiconductor device 103 is sometimes referred to as a flip chip.

A heat spreader 105 is thermally coupled to the major surface of the flip chip structure 103 that does not carry solder balls 102 through a compliant heat-transfer medium 104 known as a thermal interface material. In one embodiment, the thermal interface material is a nanocomposite phase change thermal interface material that includes one or more matrix polymers, one or more thermally conductive fillers, and one or more clay materials. The nanocomposite phase change material 104 fills small voids in the major surface of the backside of the semiconductor device 103 (the major surface without solder balls) and the corresponding surface of the heat spreader 105 to which the semiconductor device 103 is attached. The backside of the semiconductor device 103 and the surface of the heat spreader 105 to which the semiconductor device 103 is attached is a thermal interface.

The heat spreader 105 is further attached to the substrate using a sealant material 107. The sealant material 107 surrounds the device 103 and fills the gap between the substrate 101 and the heat spreader 105, forming a completely enclosed cavity containing the device 103. The use of the sealant material 107 allows for a more flexible bond between the substrate 101 and the heat spreader 105. In one embodiment the sealant material may be silicone or another sealant material. The flexible bond can help to compensate for differing coefficients of thermal expansion (CTE) between the heat spreader 105 and the substrate 101, resulting in a more consistent heat conduction pathway. In other embodiments, the sealant material is replaced with a contiguous wall of metal. The use of the sealant material 107 shown results in a lighter semiconductor package 100 than one where the sealant material is replaced with a wall of metal.

A heat sink 106 is attached to the heat spreader 105 at another thermal interface using a thermal interface material 108. In one embodiment, the thermal interface material 108 is the same material as the thermal interface material 104. In another embodiment, the thermal interface material 108 is a different nanocomposite phase change thermal interface material that includes one or more matrix polymers, one or more thermally conductive fillers, and one or more clay materials. The heat sink 106 allows for the more rapid dissipation of heat due to increased surface area for cooling. It should be noted that in some embodiments, one of the thermal interface material 104 and the thermal interface material 108 may not be a nanocomposite phase change thermal interface material that includes one or more matrix polymers, one or more thermally conductive fillers, and one or more clay materials. One of the thermal interface materials can be another type of thermal interface material.

Thermal interface materials typically include a polymer matrix and a thermally conductive filler, and encompass several classes of materials such as epoxies, greases, gels and phase change materials. It should also be noted that FIG. 1 is one example of a package 100 that uses a thermal interface material 104, 108 and that there are other types of packages. Furthermore, it should be noted that the thickness of the thermal interface material 104 and the thickness of the thermal interface material 108, as shown in FIG. 1, are thick for the purpose of illustrating the position of the thermal interface materials 104, 108. The resistance to heat transfer across a thermal interface, as shown by the following equations and text, is directly proportional to the thickness of the interface. Therefore, for the sake of thermal efficiency, it is desirable to make the thermal interface as thin as possible.

Another common style of semiconductor package is similar to that shown in FIG. 1. In this style of package (sometime known as bare die) the heat spreader 104 and thermal interface material 108 are omitted and heat sink is in direct contact with the TIM material 104.

The rate of conductive heat transfer, Q, across the interface is given by $$Q = \frac{kA(Tc - Ts)}{L}$$

where k is the thermal conductivity of the interface, A is the heat transfer area, L is the interface thickness and Tc and Ts are the device case and heat sink temperatures. The thermal resistance of a joint, Rc-s, is given by $$Rc - s = \frac{(Tc - Ts)}{Q}$$

and on rearrangement, $$Rc - s = \frac{L}{kA}$$

Thus, the thermal resistance of the joint is directly proportional to the joint thickness and inversely proportional to the thermal conductivity of the medium making up the joint and to the size of the heat transfer area. Thermal resistance is minimized by making the joint as thin as possible, increasing joint thermal conductivity by eliminating interstitial air and making certain that both surfaces are in intimate contact.

Attaching a heat sink to a semiconductor package requires that two solid surfaces be brought together into intimate contact. Unfortunately, no matter how well-prepared, solid surfaces are never really flat or smooth enough to permit intimate contact. All surfaces have a certain roughness due to microscopic hills and valleys. Superimposed on this surface roughness is a macroscopic non-planarity in the form of a concave, convex or twisted shape. As two such surfaces are brought together, only the hills of the surfaces come into physical contact. The thermal interface material must be thin and must also fill the valleys are separated and form air-filled gaps.

The nanocomposite phase change materials (PCM's) used as thermal interface materials 104, 108 comprise one or more matrix polymers, one or more thermally conductive fillers, and one or more clay materials. By exfoliating the clay into the thermal interface material, the clay particles become dispersed as very small platelets with high aspect ratio (typically greater than 200) and high surface area. Because of the high aspect ratio and surface area, very minor amounts of clay, typically less than 10 wt %, are required, and as little as 0.5 wt % provides significant, desired improvements in the thermal interface material. The clay particles improve the reliability and performance of TIM materials by slowing diffusion of oxygen and water through the thermal interface material. The resulting nanocomposite phase change material has improved high acceleration stress test ("HAST") performance, and slows the release of volatile components for reduced pump-out, bleed-out, & dry-out of the thermal interface material. The clay particles also improve the thermo-oxidative stability of the TIM for improved bake and thermal cycling ("TC") performance.

The microelectronic packages 100 that use the nanocomposite phase change materials (PCM's) as thermal interface materials comprising one or more matrix polymers, one or more thermally conductive fillers, and one or more clay materials of this invention also have improved reliability performance resulting from the improved HAST, bake, and TC performance of the PCM's of this invention. The addition of the platelet particles to the thermal interface materials results in semiconductor or microelectric packages that have improved reliability and performance. The improved reliability and performance results from reduced pump-out, reduced dry out, and improved thermo-oxidative stability of the thermal interfaced material.

Pump-out, dry out, and thermo-oxidative stability are governed by diffusion processes. The PCM's of this invention may be mixed by a wide variety of process.

This invention may be practiced with a wide variety of matrix resins. The resin typically has a melting point slightly above room temperature (i.e. about 40° C.) yet below the operating temperature of the electronic device (typically less than about 130° C.). Olefinic resins are particularly useful resin materials, and examples of useful olefinic resins include polyethylene, polypropylene, polystyrene, paraffin wax, unsaturated olefin rubbers like polybutadiene or polyisoprene, saturated rubbers like ethylene-propylene, ethylene-propylene-diene monomer (EPDM) and hydrogenated polyisoprene and the like. Optionally, other resins and additives may be added to provide additional desired properties.

The thermally conductive filler should have bulk thermal conductivity greater than about 50 W/mK. Examples of useful fillers include ceramics, such as aluminum oxide, boron nitride, aluminum nitride, and the like; metals, such as aluminum, copper, silver, and the like; and solders, such as indium. Typically the amount of thermally conductive filler is about 10 to 90 wt %, depending on several factors well known in the art, including the desired bulk thermal conductivity and the selection of the fillers.

The PCM's of the present invention comprise less than about 25 weight percent, preferably less than about 5 weight percent of clay materials that comprise platelet particles. Generally, the clay materials useful in this invention are an agglomeration of individual platelet particles that are closely stacked together like cards, in domains called tactoids. The individual platelet particles of the clays preferably have a thickness of less than about 2 nm and a diameter greater than about 10 nm, typically about 10 to about 3000 nm (see FIG. 1). Useful clay materials include natural, synthetic, and modified phyllosilicates. Natural clays include smectite clays, such as montmorillonite, saponite, hectorite, mica, vermiculite, bentonite, nontronite, beidellite, volkonskoite, magadite, kenyaite, and the like. Synthetic clays include synthetic mica, synthetic saponite, synthetic hectorite, and the like. Modified clays include fluoronated montmorillonite, fluoronated mica, and the like. Moreover, the layered clay materials are typically swellable free flowing powders having a cation exchange capacity from about 0.3 to about 3.0 milliequivalents per gram of mineral (meq/g), preferably from about 0.90 to about 1.5 meq/g.

In an embodiment of this invention, an intercalated layered clay material is prepared by the reaction of a swellable layered clay with one or more organic cations, preferably ammonium compounds, to effect partial or complete cation exchange. Numerous methods to modify layered clays with organic cations are known, and any of these may be used in the practice of this invention. One embodiment of this invention is the organic modification of a layered clay with an organic cation salt by the process of dispersing a layered clay or mixture of clays into hot water (50 to 80° C.), adding the organic cation salt (neat or dissolved in water or alcohol) with agitation, then blending for a period of time sufficient for the organic cations to exchange most of the metal cations present in the galleries between the layers of the clay material(s). Then, the organically modified layered clay material(s) is isolated by methods known in the art, including filtration, centrifugation, spray drying, and their combinations. Typically the organoclay is reduced in particle size to less than about 100 microns by methods known in art, including milling, grinding, pulverizing, hammer milling, jet milling, and their combinations.

The clay may be further treated for the purposes of aiding exfoliation in the composite and/or improving the strength of the polymer/clay interface. Any treatment that achieves the above goals may be used. Examples of useful treatments include intercalation with water-soluble or water-insoluble polymers, organic reagents or monomers, silane compounds, metals or organometallics, and/or their combinations.

Preferably, the clays are dispersed in the formulation so that most of the clay material exists as individual platelet particles, small tactoids, and small aggregates of tactoids with dimensions of less than about 20 nm. Compositions with the higher concentration of individual platelet particles and fewer tactoids or aggregates are preferred. Without being bound by any particular theory, it is believed that the improved properties of the materials of this invention are derived by the unique property of the platelet particles to reduce diffusion of gasses and low molecular weight components through the material.

Figure 2:
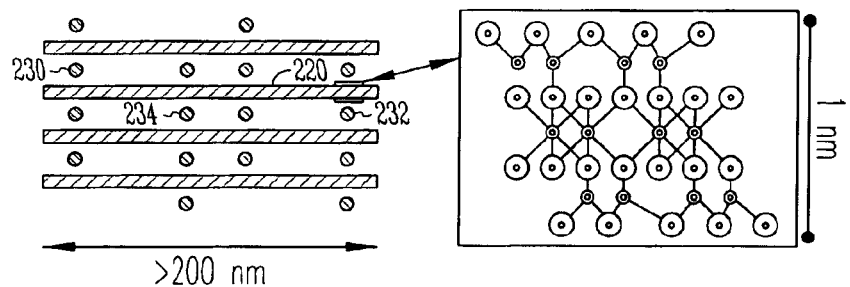
FIG. 2 is a schematic representation of layered clay material useful in an embodiment of a thermal interface material of the invention.

FIG. 2 is a schematic representation of layered clay material 210 useful in an embodiment of a thermal interface material of the invention. The clay forms layers having aspect ratios of approximately 200. As shown in FIG. 2, the thickness of a layer 220 of clay is approximately 1 nm. The length of the layer 220 of clay is approximately 200 nm. FIG. 2 also shows the structure of a clay used in one embodiment of the invention. The layers of clay, such as layer 220, reduce the rate of diffusion of gasses and low molecular weight components through the nanocomposite phase change material forming the thermal interface material. The small round objects, such as 230, 232 and 234 shown in FIG. 2 are exchangeable cations that are present between the clay layers.

Figure 3:
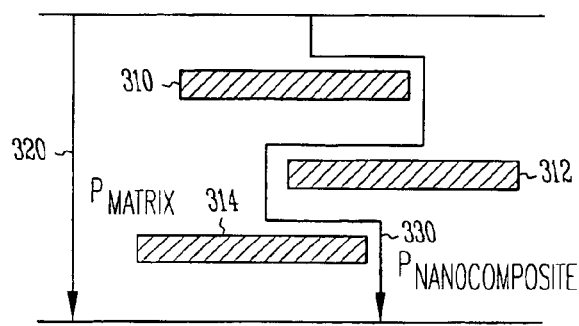
FIG. 3 is a schematic view of the platelets of clay and the tortuous path created by the platelets of clay that result in barrier improvement in the nanocomposite, according to an embodiment of this invention.

FIG. 3 is a schematic view of the platelets of clay which form layers of clay, and the tortuous path created by the platelets of clay that result in barrier improvement in the nanocomposite, according to an embodiment of this invention. One theory for explaining the improvements, such as the tortuous path theory, in which the permeant, such as the gasses and low molecular weight components depicted by reference numbers 230, 232, 234 in FIG. 2, is said to have to permeate a longer distance due to the presence of the platelet particles with large aspect ratio. FIG. 3 shows three layers or platelets of clay 310, 312, 314. The length of the path through the material without the platelets is depicted by $P_{Matrix}$ 320. The length of the path through the material with the platelets 310, 312, 314 is depicted by $P_{Nanocomposite}$ 330. In short, the platelets 310, 312, 314 create a tortuous path that lengthens the path length Of $P_{Nanocomposite}$ 330 when compared to $P_{Matrix}$ 320.

There is also an equation for the tortuous path mechanism for barrier improvement, which is as follows:

$$P_{nanocomposite} = \frac{(\text{Matrix Volume Fraction}) * (P_{matrix})}{1 + (\text{Platelet Volume Fraction}) * (\text{Platelet Aspect Ratio})/2}$$

where, $P_{Matrix}$ is the permeability of the matrix material alone $P_{Nanocomposite}$ is the permeability of the nanocomposite formulation Matrix Volume Fraction is the volume fraction of matrix (eg polymer and organic additives)

Platelet Volume Fraction is the volume fraction of clay Material

Figure 4:
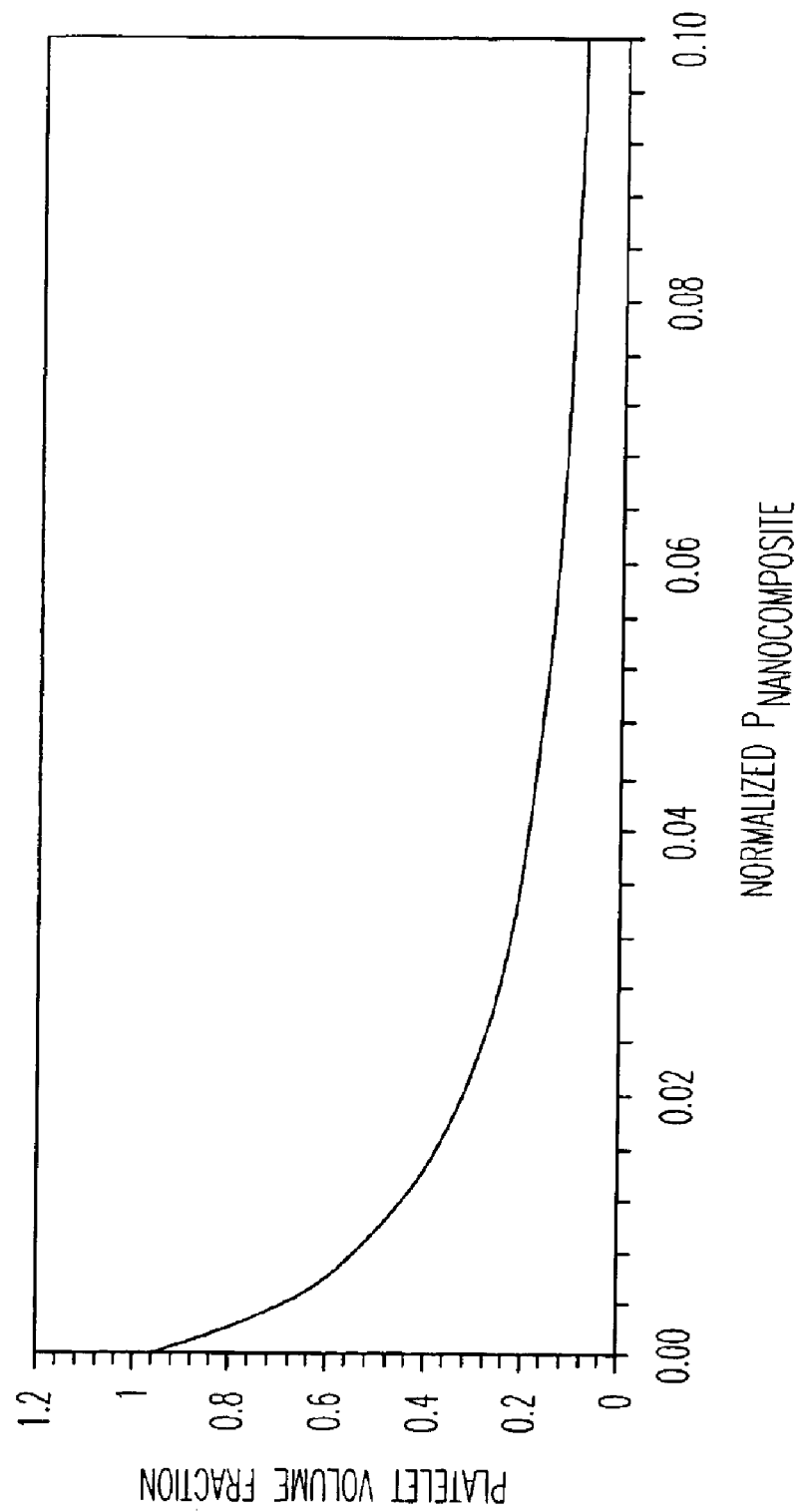
FIG. 4 is a table of platelet volume fraction versus Normalized $P_{nanocomposite}$.

Platelet Aspect Ratio is is a measure of the average diameter to length of the platelet FIG. 4 is a table of platelet volume fraction versus Normalized $P_{nanocomposite}$. FIG. 4 shows that as little as 0.01 volume fraction of platelet particles (which is 1 volume percent) reduces permeability of the nanocomposite to about half of the original permeability. Furthermore, FIG. 4 shows incorporation of a few wt % of clay significantly reduces the permeability of oxygen through the material, and that the improvement generally follows the equation according to the tortuous path model, as set forth above. Olefinic polymers, which are the base resin for PCM's, have very high oxygen permeability (typically greater than 150 cc-mil/100in$^2$-day-atm), and reduction of the oxygen permeability of olefinic PCM's provides significantly improved thermo-oxidative (bake) stability. In addition, by virtue of reduced permeability, dry-out will be lessened.

It is to be understood that the above description is intended to be illustrative and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An electronic package comprising:
a first device;
a second heat management device attached to the first device at a thermal interface; and
a thermal interface material disposed between the first device and the second heat management device, the thermal interface material further comprising:
at least one matrix polymer;
at least one thermally conductive filler dispersed within the at least one matrix polymer; and
at least one clay material dispersed within the at least one matrix polymer, wherein the at least one clay dispersed in the thermal interface material forms layers of clay and, wherein the layers of the at least one clay are swellable free flowing powders having a cation exchange capacity in the range of approximately 0.3 to about 3.0 milliequivalents per gram of mineral (meq/g).

2. The electronic package of claim 1 wherein the thermal interface material is a phase change material.

3. The electronic package of claim 1 wherein the at least one clay material dispersed within the thermal interface material is in the range of approximately 0.5 weight percent to 25 weight percent.

4. The electronic package of claim 1 wherein the at least one clay material dispersed within the thermal interface material is in the range of approximately 0.5 weight percent to 10 weight percent.

5. The electronic package of claim 1 wherein the thermal interface material is a nanocomposite.

6. The electronic package of claim 1 wherein the at least one clay dispersed in the thermal interface material includes individual platelet particles.

7. The electronic package of claim 1 wherein the at least one clay includes a smectite clay.

8. The electronic package of claim 1 wherein the at least one clay is selected from the group consisting of montmorillonite, saponite, hectorite, mica, vermiculite, bentonite, nontronite, beidellite, volkonskoite, magadite, and kenyaite.

9. The electronic package of claim 1 wherein the at least one clay is selected from the group consisting of synthetic mica, synthetic saponite, and synthetic hectorite.

10. The electronic package of claim 1 wherein the at least one clay is selected from the group consisting of natural clays, synthetic clays, and modified phyllosilicates.

11. The electronic package of claim 1 wherein the matrix polymer has a melting point slightly above room temperature and below the operating temperature of the electronic device.

12. The electronic package of claim 1 wherein the matrix polymer has a melting point in the range from about 40° C. to about 130° C.

13. The electronic package of claim 1 wherein the matrix polymer is an olefinic resin.

14. The electronic package of claim 1 wherein the matrix polymer is selected from the group consisting of polyethylene, polypropylene, polystyrene, paraffin wax unsaturated olefin rubbers like polybutadiene or polyisoprene, saturated rubbers like ethylene-propylene, ethylene-propylene-diene monomer (EPDM) and hydrogenated polyisoprene.

15. The electronic package of claim 1 wherein the matrix polymer is an unsaturated olefin rubber.

16. The electronic package of claim 15 wherein the matrix polymer is selected from the group of polybutadiene or polyisoprene.

17. The electronic package of claim 1 wherein the matrix polymer is a saturated rubber.

18. The electronic package of claim 17 wherein the matrix polymer is selected from the group consisting of ethylene-propylene, ethylene-propylene-diene monomer and hydrogenated polyisoprene.

19. The electronic package of claim 1 wherein the thermally conductive filler has a bulk thermal conductivity greater than about 50 W/mK.

20. The electronic package of claim 1 wherein the thermally conductive filler is selected from the group consisting of aluminum oxide, boron nitride, aluminum nitride, aluminum, copper, silver, and indium.

21. The electronic package of claim 1 wherein the thermally conductive filler dispersed within the thermal interface material is in the range of approximately 10 weight percent to about 90 weight percent.

22. The electronic package of claim 1 wherein the first device is a semiconductor device.

23. The electronic package of claim 1 wherein the at least one clay is an exfolliated clay.

24. An electronic package comprising:
a first device;
a second heat management device attached to the first device at a thermal interface; and
a thermal interface material disposed between the first device and the second heat management device, the thermal interface material further comprising:
at least one matrix polymer;
at least one thermally conductive filler dispersed within the at least one matrix polymer; and
at least one clay material dispersed within the at least one matrix polymer, wherein the at least one clay dispersed in the thermal interface material includes tactoids, and aggregates of tactoids with a dimension of less than about 20 nm.

25. The electronic package of claim 24 wherein the at least one clay dispersed in the thermal interface material forms layers of clay.

26. The electronic package of claim 25 wherein the layers of the at least one clay dispersed in the thermal interface material have an aspect ratio of approximately 200.

27. An electronic package comprising:
a first device;
a second heat management device attached to the first device at a thermal interface; and
a thermal interface material disposed between the first device and the second heat management device, the thermal interface material further comprising:
at least one matrix polymer;
at least one thermally conductive filler dispersed within the at least one matrix polymer; and
at least one clay material dispersed within the at least one matrix polymer, wherein the at least one clay dispersed in the thermal interface material forms layers of clay and, wherein the layers of the at least one clay are swellable free flowing powders having a cation exchange capacity in the range of approximately 0.90 to about 1.5 milliequivalents per gram of mineral (meq/g).

28. An electronic package comprising:
a first device;
a second heat management device attached to the first device at a thermal interface; and
a thermal interface material disposed between the first device and the second heat management device, the thermal interface material further comprising:
at least one matrix polymer;
at least one thermally conductive filler dispersed within the at least one matrix polymer; and
at least one exfoliated clay material dispersed within, the at least one matrix polymer, wherein the at least one exfoliated clay is selected from the group consisting of fluoronated montmorillonite, and fluoronated mica.

* * * * *

UNITED STATES PATENT AND TRADEMARK OFFICE
CERTIFICATE OF CORRECTION

PATENT NO.    : 6,924,027 B2
DATED         : August 2, 2005
INVENTOR(S)   : Matayabas, Jr. et al.

It is certified that error appears in the above-identified patent and that said Letters Patent is hereby corrected as shown below:

Column 10,
Line 59, after "within" delete ",".

Signed and Sealed this

First Day of November, 2005

JON W. DUDAS
*Director of the United States Patent and Trademark Office*